United States Patent
Elmer et al.

(10) Patent No.: US 6,442,911 B2
(45) Date of Patent: Sep. 3, 2002

(54) BUILDING GLASS FACADE OF A BUILDING, CLAMPING ARRANGEMENT IN A FACADE, AND A CLAMPING ARRANGEMENT FOR CLAMPING A BUILDING GLASS PANE IN A FACADE

(75) Inventors: Hubert Elmer, Innsbruck; Peter Leitgeb, Telfes, both of (AT)

(73) Assignee: DORMA GmbH + Co. KG, Ennepetal (DE)

( * ) Notice: Subject to any disclaimer, the term of this patent is extended or adjusted under 35 U.S.C. 154(b) by 62 days.

(21) Appl. No.: 09/730,083

(22) Filed: Dec. 5, 2000

Related U.S. Application Data (63) Continuation of application No. PCT/EP00/00004, filed on Jan. 3, 2000.

(30) Foreign Application Priority Data

Apr. 6, 1999 (DE) .......................................... 199 15 193

(51) Int. Cl.[7] .............................. E06B 3/64; E06B 3/54
(52) U.S. Cl. ................ 52/506.01; 52/235; 52/786.1; 52/786.13; 52/787.1; 52/204.66; 52/204.593; 403/388
(58) Field of Search .............................. 52/786.1, 213, 52/204.593, 204.595, 204.6, 204.62, 204.64, 204.65, 204.66, 786.13, 235, 787.1, 788.1, 506.2, 506.01, 506.05, 506.06, 783.1, 788.13, DIG. 17; 403/388, 389

(56) References Cited

U.S. PATENT DOCUMENTS

| | | | | |
|---|---|---|---|---|
| 3,382,630 A | * | 5/1968 | Chivers | 52/786.1 |
| 4,680,206 A | * | 7/1987 | Yoxon et al. | 528/34 |
| 5,138,804 A | * | 8/1992 | Roberts | 52/51 |
| 5,455,085 A | * | 10/1995 | Miller | 428/34 |
| 5,497,586 A | * | 3/1996 | Dodd et al. | 52/172 |
| 5,525,001 A | * | 6/1996 | Perkins | 403/157 |
| 5,540,514 A | * | 7/1996 | Demars et al. | 403/388 |
| 6,105,319 A | * | 8/2000 | Brunt | 52/204.593 |
| 6,131,346 A | * | 10/2000 | Kordes | 52/235 |
| 6,254,397 B1 | * | 7/2001 | Elmer | 439/6 |
| 2001/0011444 A1 | * | 8/2001 | Kenny et al. | 52/786.1 |

FOREIGN PATENT DOCUMENTS

| | | | |
|---|---|---|---|
| DE | 3927653 | 3/1991 | |
| DE | 4400979 | 7/1995 | |
| DE | 4445724 | 6/1996 | |
| DE | 19519526 | 11/1996 | |
| DE | 19519527 | 11/1996 | |
| DE | 19528489 | 2/1997 | |
| EP | 000608063 | * 7/1994 | 52/786.1 |
| EP | 0784129 | 7/1997 | |
| FR | 002480844 | * 10/1981 | 52/786.1 |
| FR | 000617190 | * 9/1994 | 52/506.01 |
| TW | 06316981 | * 11/1994 | 52/235 |

* cited by examiner

Primary Examiner—Lanna Mai
Assistant Examiner—Phi Dieu Tran A
(74) Attorney, Agent, or Firm—Nils H. Ljungman & Associates (57) ABSTRACT

Building glass facade of a building, clamping arrangement in a facade, and a clamping arrangement for clamping a building glass pane in a facade, wherein a glass pane is secured at a building-side holding device, with the glass pane being secured between two clamp elements. At the inner clamp element is supported with adjustable prestressing a bell-shaped housing and between the bell-shaped housing and the inner clamp element there is disposed a permanently elastic spring member which permits a relative movement of the bell-shaped housing relative to the inner clamp element. Joint arrangements are provided in tandem between the glass pane and the holding device at the side of the building.

20 Claims, 9 Drawing Sheets

BUILDING GLASS FACADE OF A BUILDING, CLAMPING ARRANGEMENT IN A FACADE, AND A CLAMPING ARRANGEMENT FOR CLAMPING A BUILDING GLASS PANE IN A FACADE

This application is a continuation of PCT/EP00/00004 filed Jan. 3, 2000.

BACKGROUND OF THE INVENTION

1. Field of the Invention

The present invention relates to a building glass facade of a building comprising a plurality of glass elements covering at least a portion of a building, at least one of said glass elements comprising a glass pane.

The invention further relates to a clamping arrangement in a facade for holding a glass pane on a facade.

More particularly, the invention relates to a glass pane clamping arrangement for clamping a building glass pane in a facade to a building

2. Background Information

The German Patent No. 195 19 527 A which relates to a device of the type briefly described above, in which a carrier element is connected with the holding device that is provided at the facade of the building, and the carrier element is supported at clamp elements provided at the interior of the building. Support of the carrier element is by way of a bearing portion or head portion of the carrier element, which head portion is journalled in the receiving portion or chamber of the clamp element so as to elastically yield when considered in the longitudinal axial direction of the carrier element, whereby the head portion is additionally journalled in the receiving portion such that it can accommodate lateral play, to thereby allow shifting of the carrier element or, respectively, its head portion, parallel to the plane of the glass pane upon this being impacted by pressure of wind. The elastic yielding of the head portion is afforded by spring washers or a permanently elastic material, the arrangement of which in the bearing chamber continuously effects a reset force on the carrier element or, respectively, the glass pane in the sense of a positioning of the carrier element orthogonally to the glass pane, and this, in the final analysis, causes introduction of stresses into the glass pane. Furthermore, larger tolerances between the holes in the glass pane and the point of connection at the building-side holding device can not be balanced.

German Patent No. 44 00 979 A1 also relates to a device as briefly described above. In this there is described that the clamp element (bearing seat) has, at its mantle surface directed towards the holder, a spherical surface at which is supported a compensation member which, in turn, is configured with a complementing spherical portion. The clamp element has a through bore for receiving therein the clamp screw which connects the clamp elements, and there is also provided a holding screw which passes through a spacer and the compensating member and reaches into the clamp element. This known assembly allows the adjustment of tolerances due to its configuration between the bore in a glass pane and a sub-structure (holder), however, no support of the glass pane in the manner of a resilient elastic support at the holder upon installation is provided for in this reference.

A similar installation is described in German Patent No. 44 45 724 A1, in which the clamp element that is located at the interior of the building has a spherical surface at its surface directed towards the holder, and disposed at this spherical surface is connected a drag or swing bearing of a fastening part of its complementing surface, whereby the swing bearing is held with lateral play in an encasing nut. Upon assembly, again, in this prior art reference no provision is made to permit a relative movement of the pane with respect to the fastening part. Furthermore, European Patent No. 0 784 129 A1 makes known a support of a fastening screw at a holder in which a plate which forms part of the holder is fixed between two planar-convex, lens-shaped elements which are in direct contact with their planar surfaces at the plate, whereby one of the lens-shaped elements with its convex surface is in contact at a clamp element positioned at the inside of the building and the other lens-shaped element is in contact with a nut which receives the fastening screw.

The fastening of highly sensitive glass panes, for example, in conjunction with silicon dice panes, or silicon panes, for the photovoltaic current generation, the known fastening systems do not meet the required demands. Already upon low wind pressures or, respectively, minor deformations due to conduction of heat, the silicon elements break, which is tantamount to the loss of the purpose of the glass plate or pane.

OBJECT OF THE INVENTION

An object of the invention resides in a building glass facade of a building having a provision of a fastening assembly as briefly mentioned in the introduction herein which, for one, permits an adaptation free of tension of the fastening assembly under consideration of even large tolerances of configuration during assembly thereof, and that, as well, upon assembly, there exists a sufficient elasticity between the fastening assembly and the glass pane, and the fastening assembly is capable of being able to absorb wind pressures or stresses due to heat without introduction of tension into the glass pane.

SUMMARY OF THE INVENTION

This object can be achieved with a building glass facade of a building comprising a plurality of glass elements covering at least a portion of a building, at least one of said elements comprising a glass pane, said facade comprising: at least one glass pane; said at least one glass pane comprising a first surface, a second surface, and a hole connecting said first and second surfaces; a clamping arrangement; said clamping arrangement being disposed through said hole; said clamping arrangement including a first clamp device at said first side of said glass pane and a second clamp device at said second side of said glass pane; said clamping arrangement being configured and disposed to secure said glass pane in clamped attitude; a first angle adjustment arrangement; said first angle adjustment arrangement being configured and disposed to adjust an angle of said clamping arrangement; said first angle adjustment arrangement comprising a pivot joint arrangement configured to permit substantially multi-directional pivotal movement of said second clamp device to adjust and hold the position of said glass pane securely relative to a building; said clamping arrangement being supported on said second side of said glass pane by said first pivot joint arrangement; and a second angle adjustment arrangement; said second angle adjustment arrangement being configured and disposed to adjust another angle of said clamping arrangement; said second angle adjustment arrangement being connected in tandem with said first angle adjustment arrangement to adjust for irregularities in said at least one glass pane and for irregularities in said building to thus hold the glass pane firmly in a facade of said building; said second angle adjustment arrangement comprising a pivot joint arrangement configured to permit substantially multi-directional movement of at least a portion of said first angle adjustment arrangement relative to a building to thus adjust for irregularities of said at least one glass pane and for irregularities in said building and to thus firmly hold the position of said glass pane relative to said building.

Claim 1 teaches that an interior clamp element or device has a conical or spherical surface that is provided by a permanently elastic spring member which is disposed on that glass side which is facing away from the glass pane, and against this conical or spherical surface can be set with pre-stressing a complementing or mating surface of the interior or mantle of a bell-shaped housing, whereby between the bell-shaped housing and a securement screw on one hand and a securement screw and the holding device on the other hand, there are provided pivot joints that include rigidity control, in other words, that can be locked in place or position.

The invention further teaches that wind pressure and thermal stresses are absorbed by the elastic support of the bell-shaped housing at the interior clamp element, because also after a concluded assembly there can be achieved a relative movement of the two components with respect to one another, but without the introduction of reset or restoring forces into the glass pane. This is assured by the adjustable pre-stressing effected between the clamp element and the bell-shaped housing. By means of a multi-segmented or partitioned structure of the fastening assembly by at least two pivot joints, there is provided not only a well matched adaptation to large tolerances of construction; the individual hinge points of the pivot joints form, upon being fixedly steadied during assembly, framework points that have a certain inherent elasticity, which additionally contribute to the stress-free mounting or fastening of the glass pane.

Further features of the invention are contained in the dependent claims.

In accordance with one embodiment of the invention, the interior clamp element or device itself can have, at its mantle surface area which is facing away from the glass pane, a conical or spherical area. As a matter of principle, the conical or spherical surface can be provided by the mentioned permanently elastic spring member, even when the clamp element has planar surfaces.

As well, in the interior clamp element there is provided a central through bore comprising internal screw threading for receiving thereon a locking screw which connects the clamp elements to one another, as is an adjustment screw for connecting the bell-shaped housing with the interior clamp element, whereby in accordance with the teaching of the invention, the permanently elastic spring member is configured as permanently elastic pillow which is disposed between the conical or spherical surface of the interior clamp element that is facing the glass pane and the complementing surface of the bell-shaped housing. By means of the mentioned adjustment screw for the bell-shaped housing, the permanently elastic pillow can be clamped to such an extent that not only the pillow as such absorbs stresses directed into the glass pane, but there is also provision made for a relative shifting of the bell-shaped housing with respect to the permanently elastic pillow, for supporting the glass pane in substantially stress-free manner.

In accordance with a special feature of the invention, the bell-shaped housing has, on its side facing the holding device, a cylindrical extension comprising external screw threading and between this cylindrical extension and the bell-shaped housing, in the region of the bottom wall of the bell-shaped housing, there is disposed an inwardly directed flange which serves as support for the screw head of the adjustment screw of the bell-shaped housing. A free play or motion portion provided between the flange and a shaft of the adjustment screw for the bell-shaped housing allows the arrangement of a disc in the form of a lens-shaped spacer between the flange and the screw head of the adjustment screw for the bell-shaped housing, in such a way that the shaft of the adjustment screw for the bell-shaped housing can carry out a pendulum motion relative to the bell-shaped housing. This pendulum motion is facilitated when the support surface of the flange and the complementing surface of the lens-shaped spacer extend in conical or spherical manner.

It is advantageous that use is made of a non-metallic lens-shaped spacer comprised, for example, of a hard rubber with gliding properties. In this manner, there is provided in a practical way an additional pivot joint between the bell-shaped housing and the interior clamp element and, accordingly, the glass pane.

A further pivot joint is achieved thereby that the face of the extension directed towards the holding device is curved in concave or lens-shaped manner, whereby a cup-like swivel nut or encasing nut, or bell-shaped nut, which extends over the outer screw threading of the cylindrical extension of the bell-shaped housing, has an inner bottom wall which is curved in the direction opposite to the forward face of the extension of the bell-shaped housing, such that between the forward face of the extension of the bell-shaped housing and the bottom wall of the swivel, or bell-shaped, nut there can be accommodated two lens-shaped spacers which are in contact with one another with their respective planar surfaces. By means of the above-described swivel nut the described pivot joint can be rigidly disposed when the final assembly has been established.

An advantageous embodiment of the invention resides therein that the plano-convex, lens-shaped spacer that contacts the bottom wall of the swivel, or bell-shaped nut is a component of a nut which receives the securement screw, whereby the option is provided that the securement screw can be screwed-in more or less deeply into the nut, for the purpose of a desired shortening or extending of the longitudinal extent of the entire fastening assembly. So as to achieve the mentioned pivot joint, the shaft of the nut is dimensioned such that it is passed with a free play or motion portion through a bore in the bottom wall of the bell-shaped nut.

A further pivot joint can, in known manner, be realized in the region of the direct connection of the securement screw with the holding device, thereby that the securement screw passes with a free play or motion portion through a bore in the holding device and the holding device is secured between a nut and a locknut, whereby there is provided, respectively, between the nut and the locknut on one hand and the holding device on the other hand, a plano-convex, lens-shaped spacer which is in contact with its planar surface with the holding device, and the nut and locknut have support surfaces which are complementing the surface of the lens-shaped spacer. Again, here during final assembly of the respective components there is achieved an adjustable and adaptable pivot joint which, upon completion of the assembly phase, can be controlled as to rigidity, or in other words, can be locked in place and position, whereby between the last-mentioned pivot joint, which provides the connection to the holding device, and in the pivot joint provided by the bell-shaped housing and the swivel nut there may be disposed a spacer or sleeve member.

The configuration of the clamp element which clamps the glass pane and which is provided at the exterior of the building can be in any manner; it can be provided in known manner as dish-type element or as countersunk screw, without affecting the stress-free fastening of the glass pane achieved in accordance with the invention.

In accordance with another aspect of the invention there is provided in a building glass facade of a building having at least one glass pane, a clamping arrangement for holding a glass pane on a building facade at a building, said clamping arrangement comprising: a first clamp device, said first clamp device being configured to be disposed substantially stationary at a first side of a glass pane; a second clamp device, said second clamp device comprising a clamp device and disposed at the opposite side of a glass pane; said clamping arrangement being configured and disposed to retain a glass pane in clamped attitude; a first angle adjustment arrangement being configured and disposed to adjust an angle of said clamping arrangement; said first angle adjustment arrangement comprising a pivot joint arrangement configured to permit substantially multi-directional pivotal movement of said second clamp device to adjust and maintain the position of a glass pane securely relative to a building; said clamping arrangement being supported on said second side of a glass pane by said first pivot joint arrangement; and a second angle adjustment arrangement being configured and disposed to adjust another angle of said clamping arrangement; said second angle adjustment arrangement being connected in tandem with said first angle adjustment arrangement to adjust for irregularities in a glass pane and for irregularities in a building to thus hold a glass pane firmly in a facade of a building; said second angle adjustment arrangement comprising a pivot joint arrangement configured to permit substantially multi-directional pivotal movement of at least a portion of said first angle adjustment arrangement relative to a building to thus adjust for irregularities of a glass pane and for irregularities in a building and to thus firmly hold the position of a glass pane relative to a building.

In accordance with yet another aspect of the invention there is provided a glass pane clamping arrangement for clamping a building glass pane in a facade of a building, said clamping arrangement comprising: a first clamp device, said first clamp device being configured to being substantially stationary disposed at a first side of a glass pane; a second clamp device being configured to be disposed at a second side of said glass pane opposite said first side of said glass pane; said clamping arrangement being configured and disposed to retain a glass pane in clamped attitude; a first angle adjustment arrangement being configured and disposed to adjust an angle of said clamping arrangement; said first angle adjustment arrangement comprising a pivot joint arrangement configured to permit substantially multi-directional pivotal movement of said second clamp device to adjust and maintain the position of a glass pane securely relative to a building; said clamping arrangement being supported on said second side of a glass pane by said first pivot joint arrangement; and a second angle adjustment arrangement being configured and disposed to adjust another angle of said clamping arrangement; said second angle adjustment arrangement being connected in tandem with said first angle adjustment arrangement to adjust for irregularities in a glass pane and for irregularities in a building to thus hold a glass pane firmly in a facade of a building; said second angle adjustment arrangement comprising a pivot joint arrangement configured to permit substantially multi-directional pivotal movement of at least a portion of said first angle adjustment arrangement relative to a building thus to adjust for irregularities of a glass pane and for irregularities in a building and to thus firmly hold the position of a glass pane relative to a building.

Thus, there is provided a fastening assembly for a glass pane at a building-side holding device, in other words, at a building facade, which fastening assembly includes a clamping arrangement, with an exterior and an interior clamp device, and which clamping arrangement secures the glass pane in clamped position. The fastening assembly is supported at the interior clamp device by a pivot joint arrangement which provides an articulated support.

The above-discussed embodiments of the present invention will be described further hereinbelow with reference to the accompanying figures. When the word "invention" is used in this specification, the word "invention" includes "inventions", that is, the plural of "invention". By stating "invention", the Applicants do not in any way admit that the present application does not include more than one patentably and non-obviously distinct invention, and maintain that this application may include more than one patentably and non-obviously distinct invention. The Applicants hereby assert that the disclosure of this application may include more than one invention, and, in the event that there is more than one invention, that these inventions may be patentable and non-obvious one with respect to the other.

BRIEF DESCRIPTION OF THE DRAWINGS

The invention will be described in more detail with reference to the following figures and exemplary embodiments, wherein.

DESCRIPTION OF THE PREFERRED EMBODIMENT

In the individual drawing figures, like elements are identified by like reference numerals as much as is required.

Figure 1:
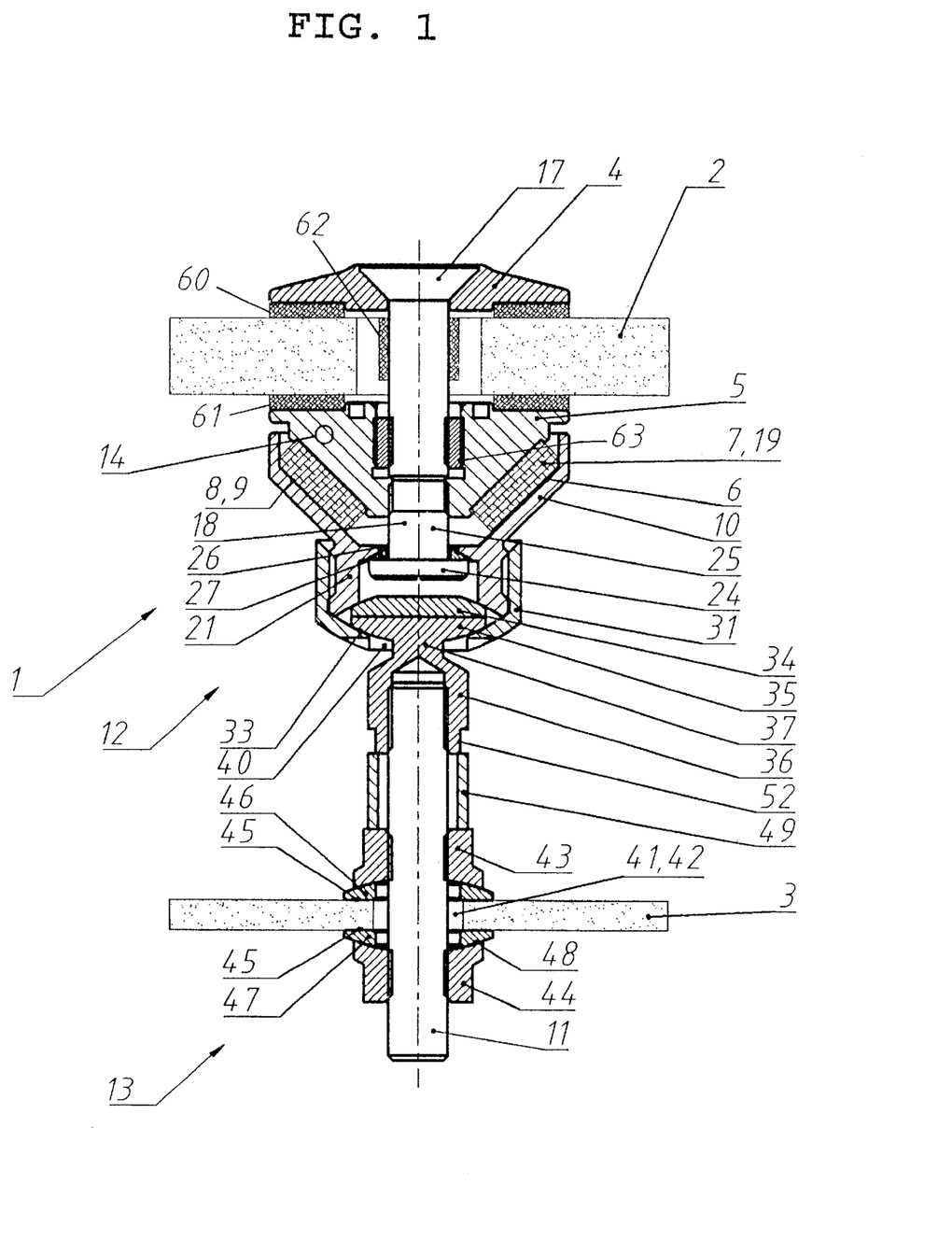
FIG. 1 is the view of FIG. 1C showing further details.
Figure 1A:
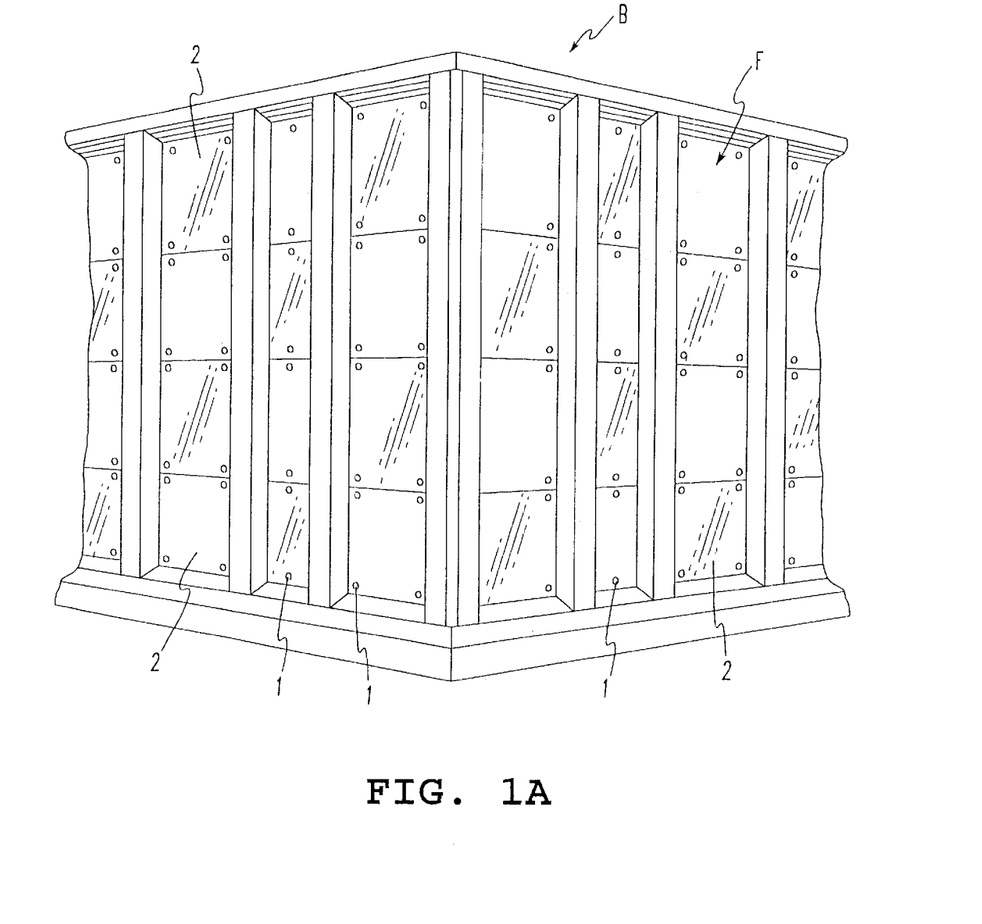
FIG. 1A is a perspective view of a building with a facade including glass pane clamping arrangements.

FIG. 1A is a copy of the FIG. 6 from U.S. Pat. No. 3,974,608 having the title "Panel wall construction", having the inventor Grearson, filed in the U.S. Patent Office on Oct. 23, 1975, and published on Aug. 17, 1976, from which figure copy all of the reference numerals present in the original figure, as it appears in U.S. Pat. No. 3,974,608, have been removed. U.S. Pat. No. 3,974,608 is hereby incorporated by reference as if set forth in its entirety. The reference numerals that have been removed from the figure for this U.S. Pat. No. 3,974,608, essentially reproduced herein as FIG. 1A, indicate arrangements that are well known in the prior art.

In one possible embodiment of the present invention, as illustrated in FIG. 1A, the invention is shown with a building B having a facade F with glass panels 2. The glass panels 2 are secured with glass pane clamping arrangements or fastening assemblies generally identified by reference numerals 1 which are placed in any desired pattern to suit the size of a glass panel 2.

Figure 1B:
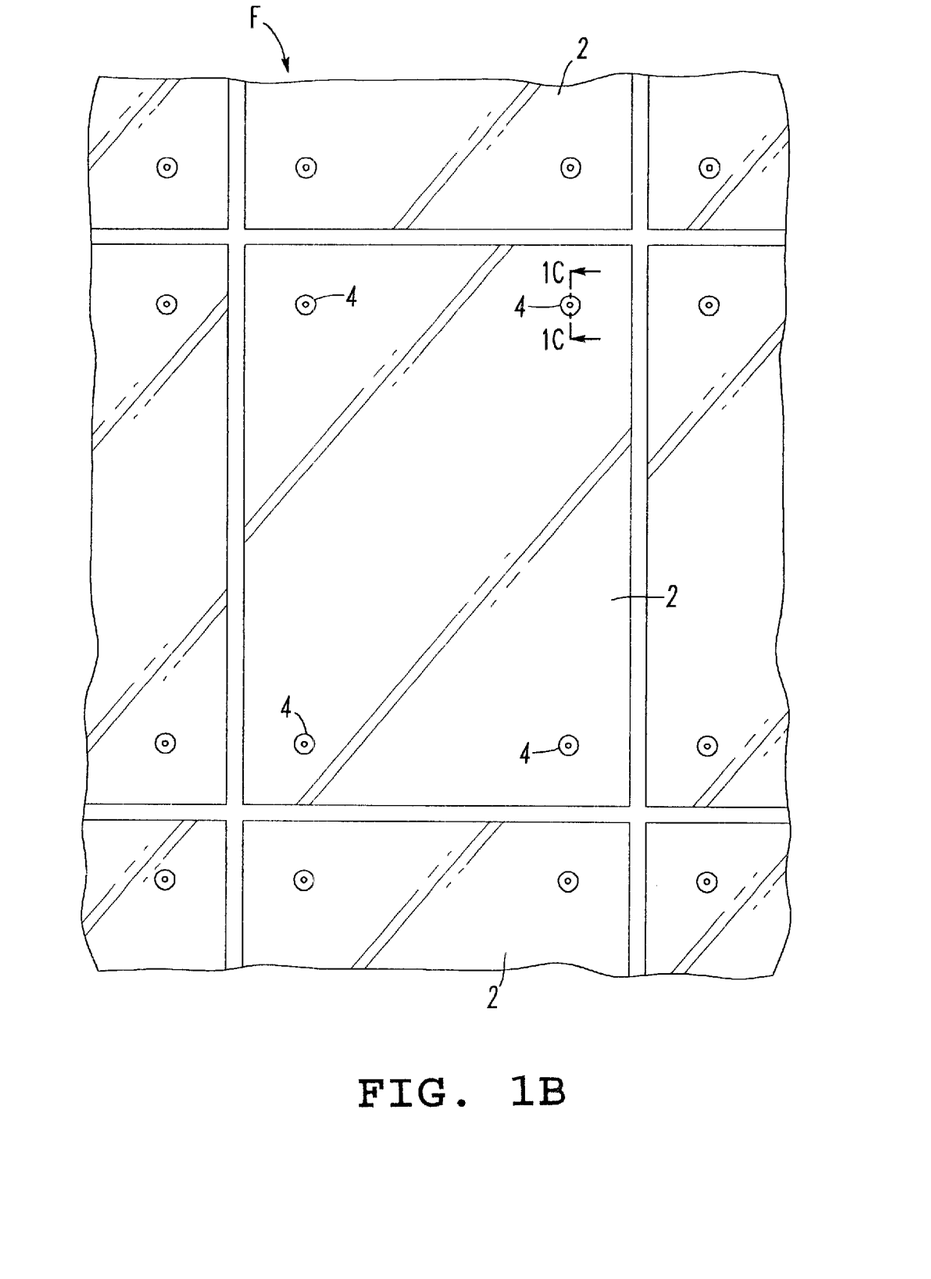
FIG. 1B is an elevation of part of a building face with glass panes.

FIG. 1B is a copy of the FIG. 1 from European Patent Application No. EP 0 784 129 A1 having the title "Suspended sheet assemblies", having the inventor McCann, filed in the European Patent Office on Jan. 13, 1997, and published on Jul. 16, 1997, from which figure copy all of the reference numerals present in the original figure, as it appears in European Patent Application No. EP 0 784 129 A1, have been removed. European Patent Application EP 0 784 129 A1 is hereby incorporated by reference as if set forth in its entirety. The reference numerals that have been removed from the figure for this European Patent Application, essentially reproduced herein as FIG. 1B, indicate arrangements that are well known in the prior art.

In one possible embodiment of the present invention, illustrated in FIG. 1B, the present invention is shown with a facade F of a building in which glass panes 2 are secured with fastening assemblies 1 as will be described in greater detail below.

Figure 1C:
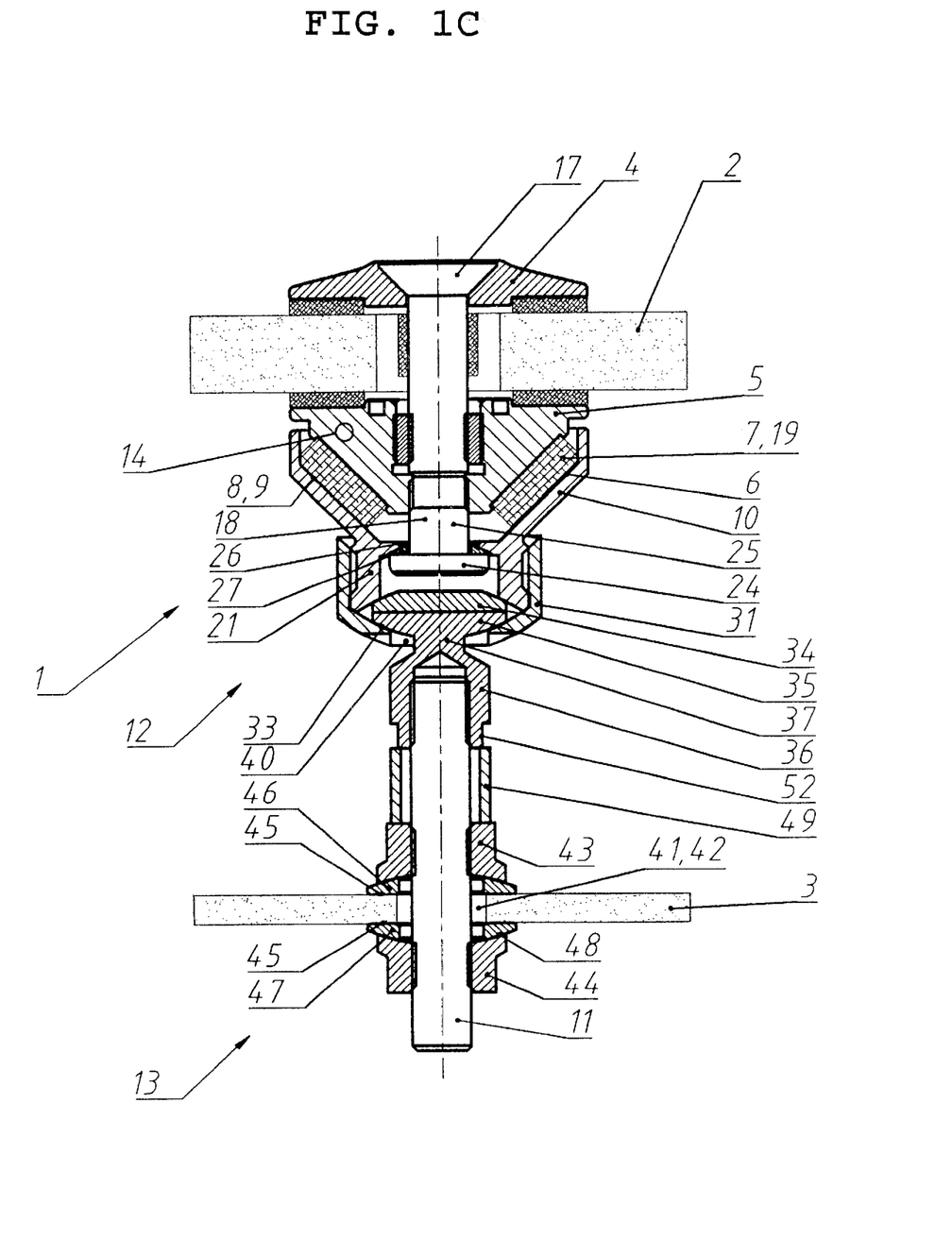
FIG. 1C is a cross-sectional view along line 1C—1C in FIG. 1B of a fastening assembly.
Figure 2:
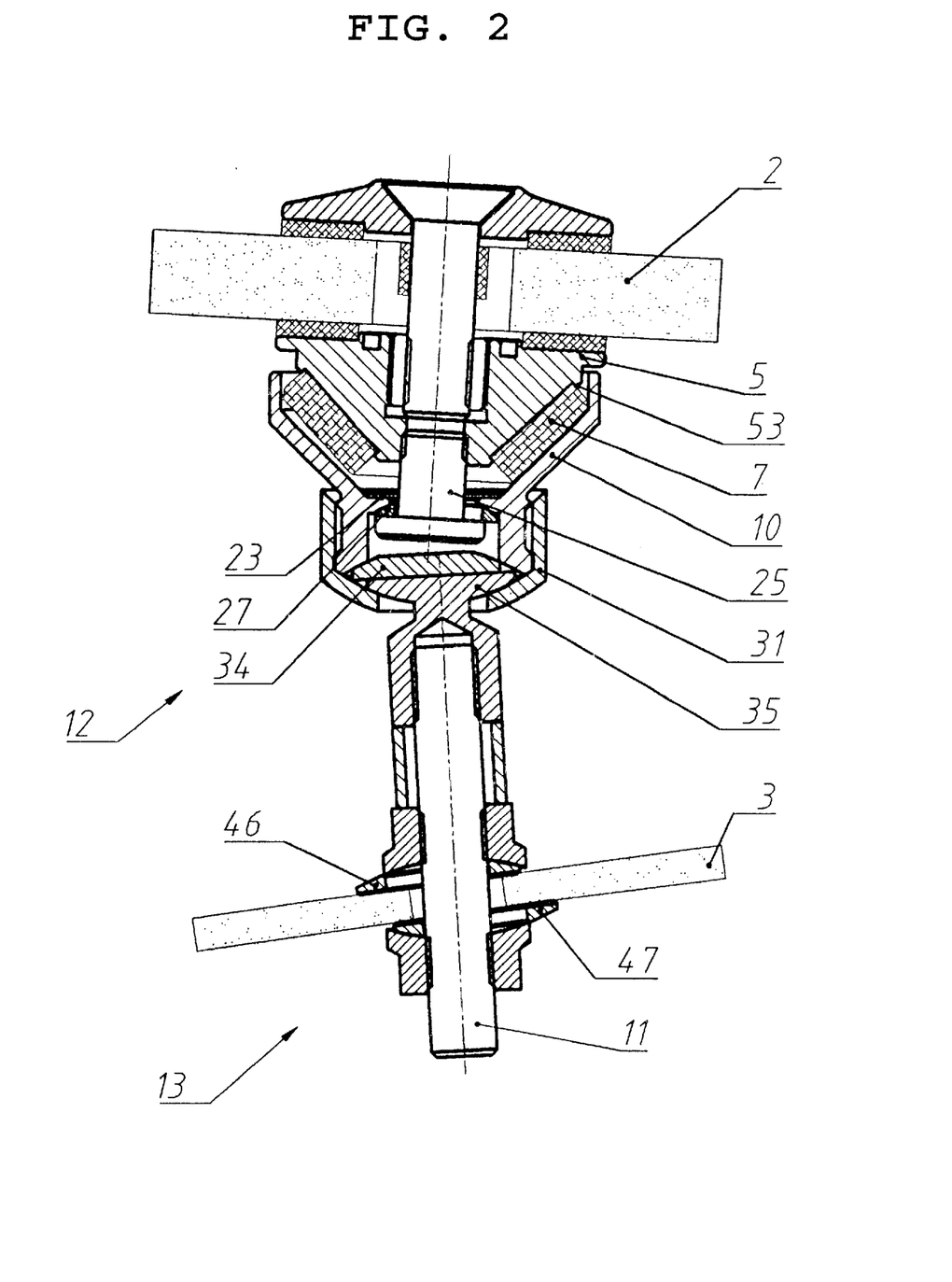
FIG. 2 shows the cross-section of FIG. 1C with a glass pane skewed relative to the holding device.
Figure 4:
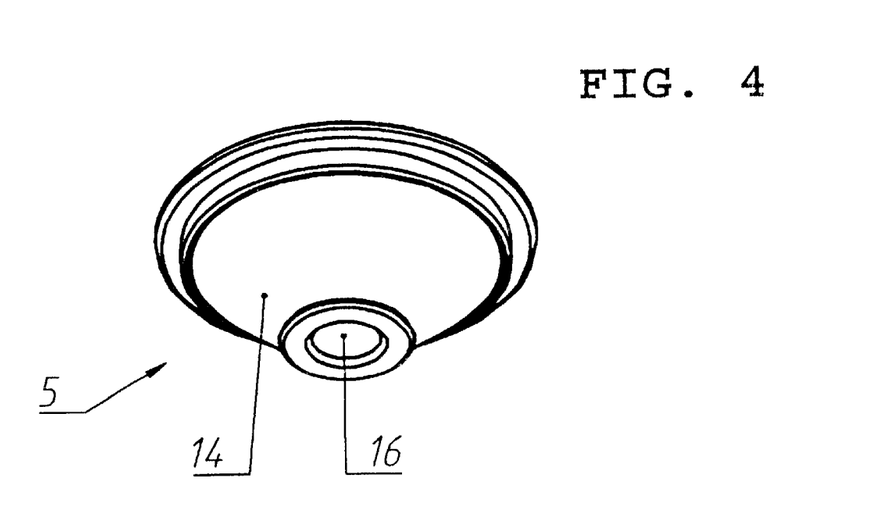
FIGS. 4 to 13 show details of: the interior clamp element, the bell-shaped housing, the lens-shaped spacer which is in contact with the bell-shaped housing of the adjustment screw for the bell-shaped housing, the nut which accommodates the securement screw, and the bell-shaped nut, respectively, in perspective and in cross-section.
Figure 5:
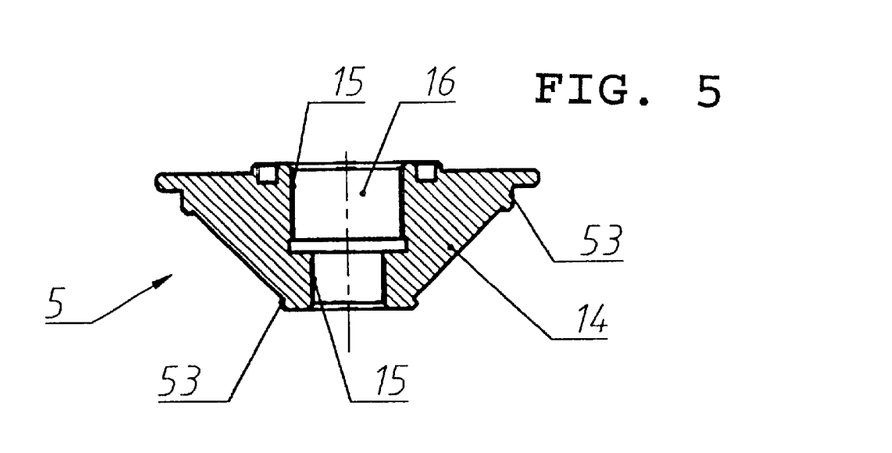
Figure 6:
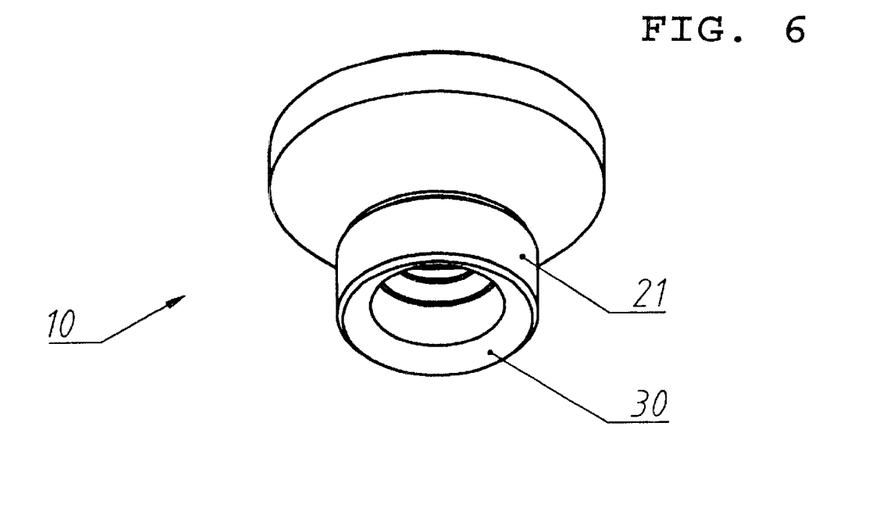
Figure 7:
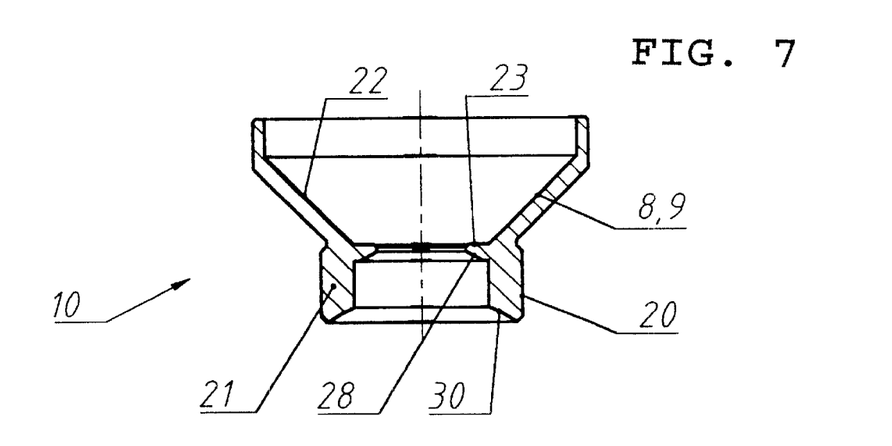

In accordance with FIG. 1C, a fastening assembly 1 has two clamp elements 4 and 5, between which is clamped a glass pane 2. The protection of the glass which is arranged in known manner and is evident from the drawing is not further identified. The interiorly disposed clamp element 5 of this embodiment has a conical mantle surface area 14, at which is in contact a permanently elastic spring member which is configured as permanently elastic pillow 19 and which is supported at a projecting portion 53. The elastic spring member, accordingly, in practical manner provides the actual mantle surface area 6 of the clamp element 5. An interior mantle surface 9 of a bell-shaped housing 10 is in contact with a complementing surface 8 at the mantle surface area 6. A locking screw 17 extends through a through bore 16 (see FIGS. 4 and 5) in the clamp element 5 and connects the two clamp elements 4 and 5. For this purpose, the through bore 16 has an inner screw threading 15. Into this inner screw threading 15 extends an adjustment screw 18 for the bell-shaped housing, and the head 24 of the screw is supported at a flange 23 of a cylindrical extension 21 of the bell-shaped housing 10. Between the flange 23 and the screw head 24 there is provided a lens-shaped spacer 27 which, preferably, is comprised of an elastic material of construction, which spacer 27 is supported at a support surface 28 of the flange 23, such that at this location there is realized a pivot joint having a free motion portion 26, as is indicated in FIG. 2. For this, the lens-shaped spacer 27 has a complementing surface 29. The cylindrical extension 21 of the bell-shaped housing 10, which extension extends from the bottom region 22, has an interior forward surface 30 which is directed towards the building-side holding device 3 and which is of concave configuration. A correspondingly oppositely configured curvature is provided by an interior bottom wall 32 of a bell-shaped nut 31, such that two lens-shaped spacers 34 and 35 can be disposed between the concave surface 30 of the-cylindrical extension 21 and a bottom wall 39 of the bell-shaped nut 31; these two lens-shaped spacers 34 and 35 have planar surfaces 33 which are in contact with one another, and of which a loose lens-shaped spacer 34 is in contact with its forward surface at the concave surface 30 of the cylindrical extension 21, while the second lens-shaped spacer 35 is a unitary component of a nut 36 which engages a securement screw 11 and on the other hand is supported with its convex surface at the bottom wall 39. The nut 36 has a shaft 37 which extends through a bore 38 in the bell-shaped nut 31 with a play or motion permitting formation 40 being present.

Figures 8, 9, 10, 11:
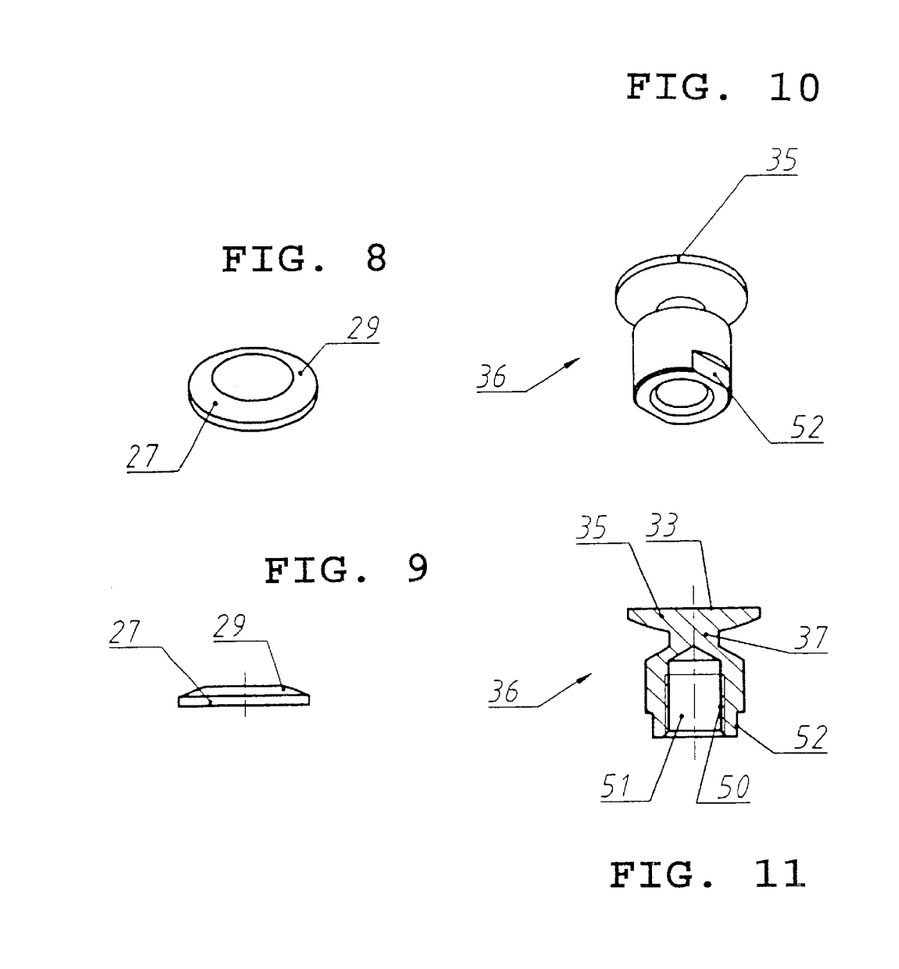
Figure 12:
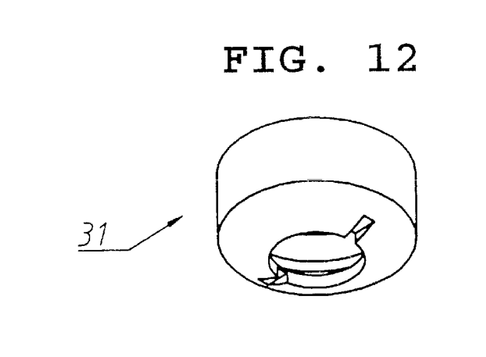
Figure 13:
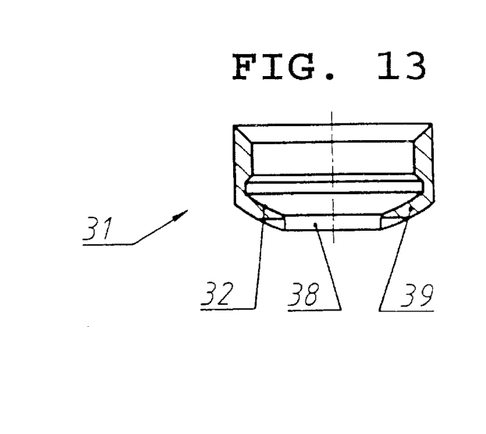

FIG. 1C illustrates that on threadingly fastening the bell-shaped nut 31 onto the bell-shaped housing 10, by way of an outer screw threading 20 in the region of the cylindrical extension 21 there can be realized a rigid connection of a pivot joint, or articulated support, which is generally identified by reference numeral 12, which is provided by the lens-shaped spacers 34 and 35, and which can be locked in place in the adjusted position. The nut 36 (see FIGS. 10 and 11) has a pocket or blind hole or bore 51 with an inner screw threading 50 into which can be threadingly inserted the securement screw 11, whereby at the outer mantle surface of the nut 36 there are provided surfaces or formations 52 for applying a wrench. FIG. 1C furthermore illustrates that in this embodiment of the invention a spacer sleeve 49 is next to the nut 36, and this spacer sleeve 49 is supported on a nut 43 which secures the building-side holding device 3. Between the nut 43 and a locknut 44 are provided lens-shaped spacers 46 and 47 which are in contact, respectively, on complementing surfaces 48 of the nut 43 and the locknut 44. Planar surfaces 45 of the lens-shaped spacers 46 and 47 are directly in contact with the building-side holding device 3. Since a securement screw 11 extends through a bore 41 of the holding device 3, with free play or a free motion formation 42, again here is realized a pivot joint, or articulated support, generally identified by reference numeral 13. This provides for adjustment of tolerances due to configuration.

FIG. 2 illustrates a possible skewed or slanted attitude of the glass pane 2 with respect to the holding device 3, in the event of a corresponding positioning of the pivot joints 12 and 13, and a respective angular attitude in the region of a shaft 25 of the adjustment screw 18 for the bell-shaped housing with respect to the bell-shaped housing 10 on one hand and with respect to the bell-shaped nut 31 on the other hand. It is illustrated that a shifting of the bell-shaped housing 10 with respect to a permanently elastic spring member 7 has occurred. This means that at this location a non-rigid or flexible pivot joint that is at hand. The permanently elastic spring member 7 has not changed its position relative to the clamp element 5, due to the support at the projecting portions 53.

Figure 3:
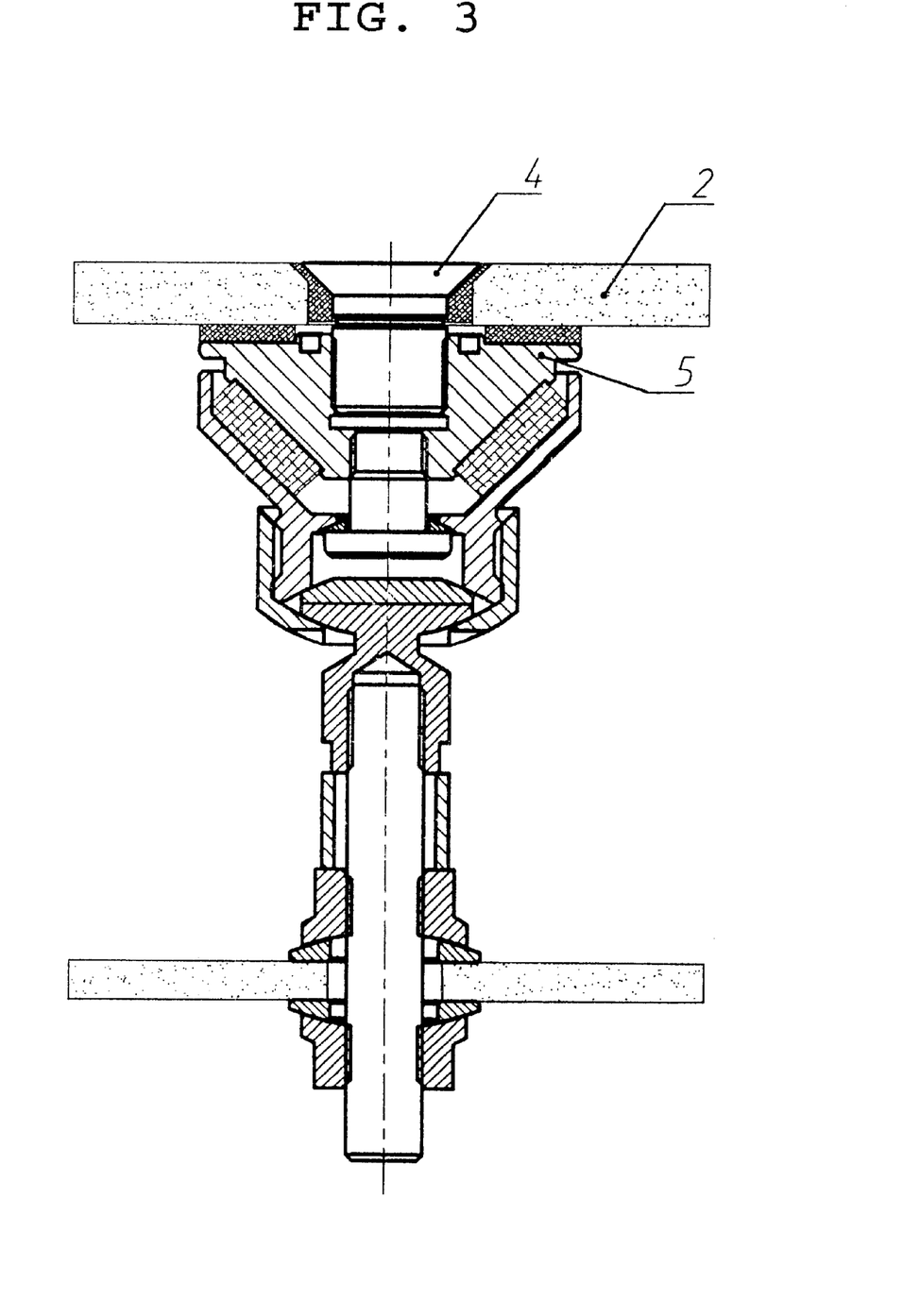
FIG. 3 shows the cross-section of FIG. 1C with a different exterior clamp element.

The embodiment in accordance with FIG. 3 is similar in its essential components to the embodiment of FIG. 1C, whereby, in contrast to FIG. 1C the exterior clamp element 4 is provided by a countersunk bolt.

Thus, the fastening assembly described in the foregoing is of use to maintain the elasticity of the glass panes 2, since it does not restrict movement of such panes and, accordingly, leads to a neutralization of forces. The fastening assembly in accordance with the invention has the capability to adapt to the adjacent requirements, and not a rigidity of the material of construction of glass, which necessarily would lead to a destruction, as is the result in the mentioned prior art.

For any type of installation of glass panes supported at a point, exteriorly or interiorly, with or without voltaic elements, the fastening assembly serves to attain a tension-free arrangement and affords a tension-free and continuous use.

In one embodiment of the invention as illustrated in FIG. 1, the glass pane 2 is secured between washers 60 and 61 between the exterior clamp element 4 and the interior clamp element 5. A sleeve 62 can be provided in the glass pane 2. The locking screw 17 may be retained with its external screw threading in a spacer or retainer 63. These elements 60, 61, 62 and 63 can be of a suitable material of construction, for example, silicon rubber or the like elastic plastic/synthetic material.

The term pivot joint is to mean an angle adjustment arrangement to provide connection which can allow substantially multi-directional movement in a free condition of assembly and the joint can be locked in position upon final assembly of the components of the clamping arrangement.

One feature of the invention resides broadly in the fastening assembly for a glass pane at a building-side holding device, which fastening assembly includes a clamping arrangement, with an interior and an exterior clamp device, which clamping arrangement secures the glass pane in clamped position, and the fastening assembly is supported at the interior clamp device by a pivot joint arrangement which provides an articulated support characterized by the fact that the clamp element 5 that extends on the interior face or surface of the glass pane has a mantle surface area 6 which is facing away from the glass pane 2 and which mantle surface area 6 comprises a conical or spherical surface (mantle surface area 6) provided by a permanently elastic spring member 7 against which a complementing surface 8 of an inner mantle surface area 9 of a bell-shaped housing can be adjusted with controlled pre-stressing, and that between the bell-shaped housing 10 and a securement screw 11 and the holding device 3 are respectively arranged pivot joint arrangements 12, 13 which can be locked in place.

Another feature of the invention resides broadly in the fastening assembly characterized by the fact that the interior clamp element 5 has a conical or spherical surface (mantle surface area 14), and that this is located at the mantle surface area 14 which is facing away from the glass pane 2.

Yet another feature of the invention resides broadly in the fastening assembly characterized by the fact that the interior clamp element 5 has a central through bore 16 which has an inner screw threading 15, that the through bore receives a locking screw 17 which connects the clamp elements 4, 5 and characterized by an adjustment screw 18 for a bell-shaped housing, which screw connects the bell-shaped housing 10 with the interior clamp element 5.

Still another feature of the invention resides broadly in the fastening assembly characterized by the fact that between the conical or spherical surface of the interior clamp element 5 that is facing away from the glass pane 2 and the complementing surface 8 of the bell-shaped housing 10 there is provided a permanently elastic pillow-shaped element 9.

A further feature of the invention resides broadly in the fastening assembly characterized by the fact that the bell-shaped housing 10 has, at its side directed towards the holding device 3, a cylindrical extension 21 which has an outer screw threading, and between the cylindrical extension and the bell-shaped housing 10, in the region of the bottom region 22 of the bell-shaped housing 10, there is provided an inwardly directed flange 23 for support of the screw head 24 of the adjustment screw 16 for the bell-shaped housing.

Another feature of the invention resides broadly in the fastening assembly characterized by the fact that between the flange 23 and a shaft 25 of the adjustment screw for the bell-shaped housing there is provided a free motion permitting play 26.

Yet another feature of the invention resides broadly in the fastening assembly characterized by the fact that between the flange and the adjustment screw 18 for the bell-shaped housing there is provided a disc (lens-shaped spacer 27).

Still another feature of the invention resides broadly in the fact that a support surface 28 of the flange 23 and a complementing surface 29 of the disc (lens-shaped spacer 27) are provided and these are configured conically or spherically.

A further feature of the invention resides broadly in the fastening assembly characterized by the fact that a surface 30 of the extension 21 of the bell-shaped housing 10 which is directed towards the holding device 3 is shaped as a concave, lens-shaped formation.

Another feature of the invention resides broadly in the fastening assembly characterized by the fact that there is provided a bell-shaped nut 31 having a cup-shaped dome portion which engages the outer screw threading 20 of the extension 21 of the bell-shaped housing 10, which bell-shaped nut has an interior bottom wall 32 which is curved in the direction opposite to the forward surface 30 of the extension 21 of the bell-shaped housing 10.

Yet another feature of the invention resides broadly in the fastening assembly characterized by the fact that between the surface 30 of the extension 21 of the bell-shaped housing 10 and the interior bottom wall 32 of the bell-shaped nut 31 there are provided two lens-shaped spacers 34, 35 which are plano-convex and in adjacent relationship with their planar surfaces 33.

Still another feature of the invention resides broadly in the fastening assembly characterized by the fact that the plano-convex lens-shaped spacer 35 which is in contact with the bottom wall 32 of the bell-shaped nut 31 is a formation of a nut 36 which receives the securement screw 11.

A further feature of the invention resides broadly in the fastening assembly characterized by the fact that a shaft 37 of the nut 36 passes with play through a bore 38 in the bottom 39 of the bell-shaped nut 31.

Another feature of the invention resides broadly in the fastening assembly characterized by the fact that the securement screw 11 passes with play 42 through a bore 41 in the holding device 3, and that the holding device 3 is secured between a nut 43 and a locknut 44, whereby between the nut 43 and/or the locknut 44 on one hand and the holding device 3 on the other hand there is provided, respectively, one lens 46, 47 of which each one is in contact with its planar surface 45 with the holding device, and the nut 43 and locknut 44 have surfaces 48 complementing the lens-shaped spacer 46, 47.

Yet another feature of the invention resides broadly in the fastening assembly characterized by the fact that a spacer sleeve 49 is disposed between a nut 36 which receives the securement screw 11 and the nut 43 which fixes the holding device 3.

Still another feature of the invention resides broadly in the fastening assembly characterized by the fact that the exterior clamp element 4 is configured as plate clamp.

A further feature of the invention resides broadly in the fastening assembly characterized by the fact that the exterior clamp element 4 is a countersunk screw.

Some examples of facades and structures thereof which may be used with embodiments of the present invention, may be found in the following U.S. Patents: U.S. Pat. No. 3,974,608, issued on Aug. 17, 1976 to Grearson and entitled "Panel wall construction", also referred to above; U.S. Pat.

No. 4,070,835, issued on Jan. 31, 1978 to Reverendi et al. and entitled "Device intended for the hooking of panels on a wall in order to constitute a covering on this wall"; U.S. Pat. No. 4,167,089, issued on Sep. 11, 1979 to Camus and entitled "Panel assembly and a panel element for a panel assembly"; U.S. Pat. No. 4,483,122, issued on Nov. 20, 1984 to Crandell and entitled "Replacement panel and method of installing same in a curtain wall"; U.S. Pat. No. 4,500,572, issued on Feb. 19, 1985 to Francis and entitled "Structural spacer glazing with connecting spacer device"; U.S. Pat. No. 4,563,849, issued on Jan. 14, 1986 to Mangal and entitled "Device for interlocking together two adjacent metal frames from two different levels"; U.S. Pat. No. 4,581,868, issued on Apr. 15, 1986 to McCann and entitled "Glass assembly"; U.S. Pat. No. 4,689,928, issued on Sep. 1, 1987 to Dutton et al. and entitled "Architectural plate glass support system"; U.S. Pat. No. 4,793,112, issued on Dec. 27, 1988 to Süfke and entitled "Facade plate composed of a composite glass structure"; U.S. Pat. No. 4,837,996, issued on Jun. 13, 1989 to Eckelt and entitled "Glass facade", also referred to below; U.S. Pat. No. 4,998,392, issued on Mar. 12, 1991 to Massarelli et al. and entitled "Device for mounting insulating double-glazing onto a fixed frame"; U.S. Pat. No. 5,014,477, issued on May 14, 1991 to MacDonald and entitled "Building facade"; U.S. Pat. No. 5,027,567, issued on Jul. 2, 1991 to Roberts and entitled "Structural glass unit"; U.S. Pat. No. 5,083,405, issued on Jan. 28, 1992 to Miller and entitled "Wall panel mounting system"; U.S. Pat. No. 5,115,612, issued on May 26, 1992 to Newton et al. and entitled "Transparent thermal pane"; U.S. Pat. No. 5,184,440, issued on Feb. 9, 1993 to Felix et al. and entitled "Metal framed facade panel and facade covered with such a panel"; U.S. Pat. No. 5,212,922, issued on May 25, 1993 to Werner and entitled "Kit for glass facades"; U.S. Pat. No. 5,301,484, issued on Apr. 12, 1994 to Jansson and entitled "Device for mounting glass facade elements"; U.S. Pat. No. 5,373,672, issued on Dec. 20, 1994 to Schulz and entitled "Arrangement of mounting sections for the fastening of a pane of glass"; U.S. Pat. No. 5,791,105, issued on Aug. 11, 1998 to Gangi and entitled "Module for the production of an all-glass facade"; U.S. Pat. No. 5,802,799, issued on Sep. 8, 1998 to Thuleskär et al. and entitled "Glazing system for buildings"; and U.S. Pat. No. 6,075,201, issued on Jun. 13, 2000 to Wambach and entitled "Photovoltaic solar module in plate form".

Some examples of plano-convex elements and spherical structures which may be used with embodiments of the present invention, may be found in the following U.S. Patents: U.S. Pat. No. 4,722,502, issued on Feb. 22, 1988 to Mueller et al. and entitled "Adjustable support system"; U.S. Pat No. 4,780,000, issued on Oct. 25, 1988 to Lewis et al. and entitled "Adjustable rod end"; U.S. Pat. No. 5,769,570, issued on Jun. 23, 1998 to Stankus et al. and entitled "Cable tensioning dome plate"; U.S. Pat. No. 5,912,936, issued on Jun. 15, 1999 to Charnley et al. and entitled "Pipe connector assembly"; U.S. Pat. No. 6,058,618, issued on May 9, 2000 to Hemmelgarn et al. and entitled "Coordinate measuring machine"; and U.S. Pat. No. 6,099,192, issued on Aug. 8, 2000 to Free and entitled "Ball joint".

Some examples of permanently elastic elements and compositions thereof which may be used with embodiments of the present invention, may be found in the following U.S. Patents: U.S. Pat. No. 4,649,685, issued on Mar. 17, 1987 to Wolf, et al. and entitled "Spacer"; U.S. Pat. No. 4,759,962, issued on Jul. 26, 1988 to Buecken et al. and entitled "Elastomeric sealing gasket assembly and its method of manufacture"; and U.S. Pat. No. 4,837,996, issued on Jun. 13, 1989 to Eckelt and entitled "Glass facade", also referred to above.

The features disclosed in the various publications, disclosed or incorporated by reference herein, may be used in the embodiments of the present invention, as well as, equivalents thereof.

The appended drawings in their entirety, including all dimensions, proportions and/or shapes in at least one embodiment of the invention, are accurate and to scale and are hereby included by reference into this specification.

All, or substantially all, of the components and methods of the various embodiments may be used with at least one embodiment or all of the embodiments, if more than one embodiment is described herein.

All of the patents, patent applications and publications recited herein, and in the Declaration attached hereto, are hereby incorporated by reference as if set forth in their entirety herein.

The following patents, patent applications, or patent publications, which were cited in the International Search Report dated May 3, 2000, and/or cited elsewhere are hereby incorporated by reference as if set forth in their entirety herein as follows:

DE 195 19 527S (SEELE), dated Nov. 28, 1996; DE 44 00 979 A (JOSEF GARTNER), dated Jul. 27, 1995; DE 44 45 724 A (JOSEF GARTNER), dated Jun. 27, 1996; EP 0 784 129 A (PILKINGTON UNITED KINGDOM), dated Jul. 16, 1997; DE 195 19 526 A (SEELE), dated Nov. 28, 1996; DE 39 27 653 A (R. DANZ), dated Mar. 14, 1991; and DE 195 28 489 A (ARNOLD), dated Feb. 6, 1997.

The corresponding foreign and international patent publication applications, namely, Federal Republic of Germany Patent Application No. 199 15 193.6, filed on Apr. 6, 1999, having inventors Hubert ELMER and Peter LEITGEB, and DE-OS 199 15 193.6 and DE-PS 199 15 193.6 and International Application No. PCT/EP99/00004, filed on Jan. 3, 2000, as well as their published equivalents, and other equivalents or corresponding applications, if any, in corresponding cases in the Federal Republic of Germany and elsewhere, and the references cited in any of the documents cited herein, are hereby incorporated by reference as if set forth in their entirety herein.

The details in the patents, patent applications and publications may be considered to be incorporable, at Applicants' option, into the claims during prosecution as further limitations in the claims to patentably distinguish any amended claims from any applied prior art.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clauses are intended to cover the structures described herein as performing the recited function and not only structural equivalents but also equivalent structures.

This invention as described hereinabove in the context of the preferred embodiments is not to be taken as limited to all of the provided details thereof, since modifications and variations thereof may be made without departing from the spirit and scope of the invention.

List of Reference Symbols

1. Fastening assembly
2. Glass pane

3. Building-side holding device
4. Clamp element (exterior)
5. Clamp element (interior)
6. Mantle surface area of 5
7. Permanently elastic spring member (compare 19)
8. Complementing surface of 10
9. Inner mantle surface area of 10
10. Bell-shaped housing
11. Securement screw
12. Pivot joint of first angle adjustment arrangement
13. Pivot joint of second angle adjustment arrangement
14. Mantle surface area of 5
15. Internal screw threading of 10
16. Bore of 5
17. Locking screw (upper)
18. Adjustment screw for bell-shaped housing
19. Permanently elastic pillow-shaped member (compare 7)
20. External screw threading on 21 of 10
21. Cylindrical extension of 10
22. Bottom region of 10
23. Flange (interior) of 10
24. Head of screw of 18
25. Shaft of 18
26. Play, free motion portion
27. Lens-shaped spacer (preferably elastic)
28. Support surface of 10
29. Complementing surface of 27
30. Interior concave surface in 21
31. Bell-shaped nut
32. Interior bottom wall (pot) of 32
33. Planar surface of 36
34. Lens-shaped spacer (loose)
35. [beveled/chamfered part or spherical element]
36. Lens-shaped formation of 36
37. Nut—socket-type nut
38. Shaft of 36
39. Bore in 31
40. Bottom, configured like a pot, of 31
41. Play, free motion permitting formation or portion
42. Bore in 3
43. Play/motion permitting formation or portion
44. Nut
45. Locknut
46. Planar surfaces of 46 and 47
47. Lens-shaped spacer, exterior, building-side
48. Lens-shaped spacer, interior
49. complementing/mating surfaces of 43 and 44
50. Spacer, sleeve
51. Internal screw threading of 51
52. Pocket or blind hole/bore in 36
53. Surfaces/formations for applying a wrench
54. Projecting portion of 5 (FIG. 5)
55. Washer
56. Washer
57. Sleeve
58. Spacer/locking screw retainer
B Building
F Facade of building

What is claimed is:

1. A building glass facade of a building comprising a plurality of glass elements covering at least a portion of the building, at least one of said elements comprising a glass pane, said facade comprising:
    at least one glass pane;
    said at least one glass pane comprising a first surface, a second surface, and a hole connecting said first and second surfaces;
    a clamping arrangement;
    said clamping arrangement being disposed through said hole,
    said clamping arrangement including a first clamp device at said first side of said glass pane and a second clamp device at said second side of said glass pane;
    said clamping arrangement being configured and disposed to secure said glass pane in a clamped attitude;
    a first angle adjustment arrangement;
    said first angle adjustment arrangement being configured and disposed to adjust an angle of said clamping arrangement;
    said first angle adjustment arrangement comprising a pivot joint arrangement configured to permit substantially multi-directional pivotal movement of said second clamp device to adjust and hold the position of said glass pane securely relative to the building;
    said clamping arrangement being supported on said second side of said glass pane by said first pivot joint arrangement; and
    a second angle adjustment arrangement;
    said second angle adjustment arrangement being configured and disposed to adjust another angle of said clamping arrangement;
    said second angle adjustment arrangement being connected in tandem with said first angle adjustment arrangement to adjust for irregularities in said at least one glass pane and for irregularities in the building to thus hold the glass pane firmly in the facade of the building;
    said second angle adjustment arrangement comprising a pivot joint arrangement configured to permit substantially multi-directional movement of at least a portion of said first angle adjustment arrangement relative to the building to thus adjust for irregularities of said at least one glass pane and for irregularities in the building and to thus firmly hold the position of said glass pane relative to the building.

2. The facade according to claim 1 wherein said first clamp device comprises a plate clamp.

3. The facade according to claim 2 wherein said plate clamp includes a countersunk screw.

4. In a building glass facade of a building having at least one glass pane, a clamping arrangement for holding a glass pane on the building facade at the building, said clamping arrangement comprising:
    a first clamp device, said first clamp device being configured to be disposed substantially stationary at a first side of the glass pane;
    a second clamp device, said second clamp device comprising a clamp device and disposed at an opposite side of the glass pane;
    said clamping arrangement being configured and disposed to retain the glass pane in a clamped attitude;
    a first angle adjustment arrangement being configured and disposed to adjust an angle of said clamping arrangement;
    said first angle adjustment arrangement comprising a pivot joint arrangement configured to permit substantially multi-directional pivotal movement of said second clamp device to adjust and maintain the position of the glass pane securely relative to the building;
    said clamping arrangement being supported on said opposite side of the glass pane by said first pivot joint arrangement; and a second angle adjustment arrangement being configured and disposed to adjust another angle of said clamping arrangement;

said second angle adjustment arrangement being connected in tandem with said first angle adjustment arrangement to adjust for irregularities in the glass pane and for irregularities in the building to thus hold the glass pane firmly in the facade of the building;

said second angle adjustment arrangement comprising a pivot joint arrangement configured to permit substantially multi-directional pivotal movement of at least a portion of said first angle adjustment arrangement relative to the building to thus adjust for irregularities of the glass pane and for irregularities in the building and to thus firmly hold the position of the glass pane relative to the building.

5. A glass pane clamping arrangement for clamping and installing a building glass pane in a facade of a building, said clamping arrangement comprising:

a first clamp device, said first clamp device being configured to be disposed upon installation of said glass pane clamping arrangement substantially stationary at a first side of the glass pane;

a second clamp device being configured to be disposed upon installation of said glass pane clamping arrangement at a second side of the glass pane opposite the first side of the glass pane;

said clamping arrangement being configured to be disposed upon installation of said glass pane clamping arrangement to retain the glass pane in a clamped attitude;

a first angle adjustment arrangement being configured and disposed to adjust an angle of said clamping arrangement;

said first angle adjustment arrangement comprising a pivot joint arrangement configured to permit upon installation of said glass pane clamping arrangement substantially multi-directional pivotal movement of said second clamp device to adjust and maintain the position of the glass pane securely relative to the building upon installation of said glass pane clamping arrangement;

said clamping arrangement being configured to be supported upon installation of said glass pane clamping arrangement on the second side of the glass pane by said first pivot joint arrangement; and a second angle adjustment arrangement being configured and disposed to adjust another angle of said clamping arrangement;

said second angle adjustment arrangement being connected in tandem with said first angle adjustment arrangement to adjust upon installation of said glass pane clamping arrangement for irregularities in the glass pane and for irregularities in the building to thus hold the glass pane firmly in the facade of the building upon installation of said glass pane clamping arrangement;

said second angle adjustment arrangement comprising a second pivot joint arrangement configured to permit upon installation of said glass pane clamping arrangement substantially multi-directional pivotal movement of at least a portion of said first angle adjustment arrangement relative to the building to adjust upon installation of said glass pane clamping arrangement for irregularities of the glass pane and to adjust upon installation of said glass pane clamping arrangement for irregularities in the building and to thus firmly hold the position of the glass pane relative to the building upon installation of said glass pane clamping arrangement.

6. The glass pane clamping arrangement according to claim 5 wherein said second clamp device comprises a first portion configured to be directed to the glass pane upon installation of said glass pane clamping arrangement and a second portion configured to be directed away from the glass pane upon installation of said glass pane clamping arrangement;

said second portion of said second clamp device being configured with a mantle surface area;

said mantle surface area of said second portion comprising one of: a conical or a spherical surface area;

and further comprising:

a bell-shaped housing, said bell-shaped housing comprising a portion defining an inner mantle surface area;

said inner mantle surface area of said bell-shaped housing being configured with a corresponding shape to mate with the selected surface area of said second portion of said second clamp device; and said bell-shaped housing being disposed adjacent said second clamp device.

7. The glass pane clamping arrangement according to claim 6 and further comprising:

an elastic spring member;

said elastic spring member being configured with a first surface to mate with the selected surface of said second clamp device and with a second surface configured to mate with said inner mantle surface area of said bell-shaped housing and to adjust upon installation of said glass pane clamping arrangement pre-stressing of the glass pane by said clamping arrangement.

8. The glass pane clamping arrangement according to claim 7 wherein said first clamp device and said second clamp device are configured with a bore;

a wall of said bore comprising internal screw threading, said internal screw threading being disposed at least in said second clamp device; and further comprising:

a tightening arrangement;

said tightening arrangement including a locking screw;

said locking screw being configured with external screw threading in at least a portion of its length;

said locking screw being configured to be disposed upon installation of said glass pane clamping arrangement to extend through the bore of said first clamp device, the glass pane, and said second clamp device, to clamp the glass pane upon installation of said glass pane clamping arrangement between said first clamp device and said second clamp device by the interaction of the external screw threading of said locking screw with the internal screw threading of said second clamp device;

said tightening arrangement further including:

an adjustment screw to adjust the clamping force with which said bell-shaped housing is pressed against the selected surface of said second clamp element.

9. The glass pane clamping arrangement according to claim 8 wherein said elastic element is configured in the shape of a pillow upon being viewed in transverse cross-section; and said elastic member being disposed between the selected surface of said second clamp device and the mating surface of said bell-shaped housing.

10. The glass pane clamping arrangement according to claim 9 and further comprising;
   a holding device configured to support said second angle adjustment arrangement at the building upon installation of said glass pane clamping arrangement;
   said bell-shaped housing comprising a cylindrical extension;
   said cylindrical extension of said bell-shaped housing being disposed at a portion of said bell-shaped housing that is disposed towards said holding device;
   said cylindrical-extension comprising an external screw threading; and
   said cylindrical extension further comprising:
      an interior flange configured to be disposed adjacent said cylindrical extension;
      said adjustment screw comprising a shaft portion and a screw head portion;
      said screw head portion being disposed adjacent said interior flange of said bell-shaped housing.

11. The glass pane clamping arrangement according to claim 10 wherein said shaft portion of said adjustment screw is disposed with free play adjacent said interior flange.

12. The glass pane clamping arrangement according to claim 11 and further comprising:
   a disc-shaped member;
   said disc-shaped member comprising a lens-shaped spacer configured to be disposed between said interior flange of said bell-shaped housing and said screw head portion of said adjustment screw.

13. The glass pane clamping arrangement according to claim 12 wherein said interior flange of said bell-shaped housing comprises a support surface, and said lens-shaped spacer comprises a surface to mate with said support surface, said support surface and said surface to mate is one of: a conical or spherical surface.

14. The glass pane clamping arrangement according to claim 13 wherein a portion of said cylindrical extension of said bell-shaped housing comprises a seat surface disposed towards said holding device to seat thereon a portion of said first pivot joint arrangement;
   said seat surface of said cylindrical extension being configured as a concave, lens-shaped surface.

15. The glass pane clamping arrangement according to claim 14 and further comprising:
   a bell-shaped nut;
   said bell-shaped nut being configured with an exterior wall to encase said cylindrical extension of said bell shaped housing and with internal screw threading to engage said external screw threading of said cylindrical extension of said bell-shaped housing;
   said bell-shaped nut comprising an interior wall which is curved in the direction opposite to the curvature of said seat surface of said cylindrical extension, to mate with said seat surface of said cylindrical extension.

16. The glass pane clamping arrangement according to claim 15 wherein said first pivot joint arrangement comprises:
   a further lens-shaped spacer;
   said further lens-shaped spacer comprising a planar portion and a convex portion; said convex portion being disposed adjacent said seat surface of said cylindrical extension; and
   a yet further lens-shaped spacer;
   said yet further lens-shaped spacer comprising a planar portion and a convex portion;
   said convex portion of said yet further lens-shaped spacer being disposed adjacent said interior wall of said bell-shaped nut; and
   said further lens-shaped spacer and said yet further lens-shaped spacer being in contact with one another with their planar port ions.

17. The glass pane clamping arrangement according to claim 16 wherein said yet further lens-shaped spacer that is disposed in contact with said interior wall of said bell-shaped nut;
   said yet further lens-shaped spacer comprising:
   a portion having internal screw threading; and
   said tightening arrangement further including:
      a securement screw disposed in said internal screw threading of said yet further lens-shaped spacer.

18. The glass pane clamping arrangement according to claim 17 wherein said yet further lens-shaped spacer comprises:
   a shaft portion; and
   wherein said bottom wall of said bell-shaped nut comprises a bore;
   said shaft portion being disposed in said bore with free play.

19. The glass pane clamping arrangement according to claim 18 wherein said second pivot joint arrangement includes:
   a first lens-shaped annular member;
   said first lens-shaped annular member comprising a convex portion and a planar portion;
   said planar portion being disposed on a first surface of said holding device;
   a second lens-shaped annular member comprising a convex portion and a planar portion;
   said planar portion of said second lens-shaped annular member being disposed on a second surface of said holding device;
   said securement screw passing with play through a bore in said holding device, through said first lens-shaped annular member, and through said second lens-shaped annular member;
   a nut disposed on said securement screw adjacent said first lens-shaped annular member to tighten said first lens-shaped annular member against said holding device; and
   a locknut disposed on said securement screw adjacent said second lens-shaped annular member to tighten said second lens-shaped annular member against said holding device;
   said nut and said locknut comprising mating convex surfaces for the convex portions of said first and second lens-shaped annular members.

20. The glass pane clamping arrangement according to claim 19 and further comprising:
   a spacer sleeve disposed between said portion having internal screw threading of said yet further lens-shaped spacer and said nut that is disposed adjacent said first lens-shaped annular member.

* * * * *